US012386256B2

(12) United States Patent
Yoshizawa et al.

(10) Patent No.: US 12,386,256 B2
(45) Date of Patent: Aug. 12, 2025

(54) PHOTOSENSITIVE RESIN COMPOSITION, METHOD FOR PRODUCING PATTERNED CURED FILM, CURED FILM, INTERLAYER INSULATING FILM, COVER COAT LAYER, SURFACE PROTECTIVE FILM, AND ELECTRONIC COMPONENT

(71) Applicant: HD MICROSYSTEMS, LTD., Tokyo (JP)

(72) Inventors: Atsutaro Yoshizawa, Hitachi (JP); Satoshi Yoneda, Hitachi (JP); Akira Asada, Hitachi (JP); Masayuki Ohe, Hitachi (JP); Tetsuya Enomoto, Hitachi (JP)

(73) Assignee: HD MICROSYSTEMS, LTD., Tokyo (JP)

( * ) Notice: Subject to any disclaimer, the term of this patent is extended or adjusted under 35 U.S.C. 154(b) by 606 days.

(21) Appl. No.: 17/266,317

(22) PCT Filed: Aug. 5, 2019

(86) PCT No.: PCT/JP2019/030771
§ 371 (c)(1),
(2) Date: Feb. 5, 2021

(87) PCT Pub. No.: WO2020/031976
PCT Pub. Date: Feb. 13, 2020

(65) Prior Publication Data
US 2021/0311390 A1 Oct. 7, 2021

(30) Foreign Application Priority Data

Aug. 6, 2018 (WO) .................. PCT/JP2018/029468

(51) Int. Cl.
*G03F 7/031* (2006.01)
*C08G 73/10* (2006.01)
(Continued)

(52) U.S. Cl.
CPC ............. *G03F 7/031* (2013.01); *C08G 73/10* (2013.01); *G03F 7/028* (2013.01); *G03F 7/0387* (2013.01); *G03F 7/40* (2013.01)

(58) Field of Classification Search
CPC ............................... G03F 7/028; G03F 7/0387
See application file for complete search history.

(56) References Cited

U.S. PATENT DOCUMENTS 5,025,088 A   6/1991  Maeda
6,485,886 B1  11/2002 Yamato et al.
(Continued)

FOREIGN PATENT DOCUMENTS

JP  2004-133435 A  4/2004
JP  2006-098514 A  4/2006
(Continued)

OTHER PUBLICATIONS

English translation of JP2016069498. (Year: 2016).*
(Continued)

*Primary Examiner* — Mark F. Huff
*Assistant Examiner* — Anna Malloy
(74) *Attorney, Agent, or Firm* — FITCH, EVEN, TABIN & FLANNERY, LLP

(57) ABSTRACT

A photosensitive resin composition comprises a polyimide precursor having a polymerizable unsaturated bond; one or more compounds represented by any of the following formulas (1) to (4); and photopolymerization initiator represented by the following formula (11). In formulas (1) to (4), $R^1$, $R^2$, and $R^8$ are independently an alkyl group including 1 to 4 carbon atoms, and $R^3$ to $R^7$ are independently a hydrogen atom, or an alkyl group including 1 to 4 carbon atoms; and in the formula (11), $R^{11}$ is an alkyl or alkoxy group including 1 to 12 carbon atoms, a cycloalkyl group including 4 to 10 carbon atoms, a phenyl group, or a tolyl (Continued)

group; $R^{12}$ is an alkyl group including 1 to 12 carbon atoms, a cycloalkyl group including 4 to 10 carbon atoms, a phenyl group, or a tolyl group; and $R^{13}$ is a benzoyl group, a fluorenyl group, or a carbazolyl group.

9 Claims, 1 Drawing Sheet

(51) Int. Cl.
*G03F 7/028* (2006.01)
*G03F 7/038* (2006.01)
*G03F 7/40* (2006.01)

(56) References Cited

U.S. PATENT DOCUMENTS

| | | | |
|---|---|---|---|
| 6,512,020 | B1 | 1/2003 | Asakura et al. |
| 7,026,094 | B2 | 4/2006 | Matsumoto et al. |
| 7,282,323 | B2 | 10/2007 | Kanatani |
| 8,148,045 | B2 | 4/2012 | Murata et al. |
| 8,293,436 | B2 | 10/2012 | Sasaki |
| 8,349,548 | B2 | 1/2013 | Matsumoto et al. |
| 8,586,268 | B2 | 11/2013 | Matsumoto et al. |
| 8,759,989 | B2 | 6/2014 | Matsumura et al. |
| 10,719,016 | B2 | 7/2020 | Yorisue et al. |
| 10,948,821 | B2 | 3/2021 | Kiuchi et al. |
| 11,226,560 | B2 * | 1/2022 | Saito ................ G03F 7/037 |
| 11,487,201 | B2 * | 11/2022 | Tsuchiya ............ C08G 73/12 |
| 2006/0068330 | A1 | 3/2006 | Kamijima |
| 2015/0372037 | A1 | 12/2015 | Tomeba |
| 2019/0113845 | A1 * | 4/2019 | Yorisue ............ G03F 7/0387 |

FOREIGN PATENT DOCUMENTS

| | | | | | |
|---|---|---|---|---|---|
| JP | 2006-193691 | A | | 7/2006 | |
| JP | 2006-342310 | A | | 12/2006 | |
| JP | 2007206423 | A | * | 8/2007 | |
| JP | 2009-227959 | A | | 10/2009 | |
| JP | 2009-265520 | A | | 11/2009 | |
| JP | 2012-198361 | A | | 10/2012 | |
| JP | 2014-052592 | A | | 3/2014 | |
| JP | 2015-127817 | A | | 7/2015 | |
| JP | 2015-155199 | A | | 8/2015 | |
| JP | 2015232688 | A | * | 12/2015 | ........... G03F 7/0045 |
| JP | 2016-008992 | A | | 1/2016 | |
| JP | 2016-079340 | A | | 5/2016 | |
| JP | 2016069498 | A | * | 5/2016 | |
| JP | 2016-199662 | A | | 12/2016 | |
| JP | 2016-200643 | A | | 12/2016 | |
| WO | 2006/098291 | A1 | | 9/2006 | |
| WO | 2015/052885 | A1 | | 4/2015 | |
| WO | 2015/125469 | A1 | | 8/2015 | |
| WO | 2015/199219 | A1 | | 12/2015 | |
| WO | WO-2017038664 | A1 | * | 3/2017 | ................ C08F 2/44 |

OTHER PUBLICATIONS

English translation of WO2017038664. (Year: 2017).*
English translation of JP2007206423. (Year: 2007).*
English translation of JP2015232688. (Year: 2015).*
Semiconductor Technical Yearbook, 2013, Nikkei Electronics, Nikkei Business Publications, Inc. (some drawings with English description).

* cited by examiner

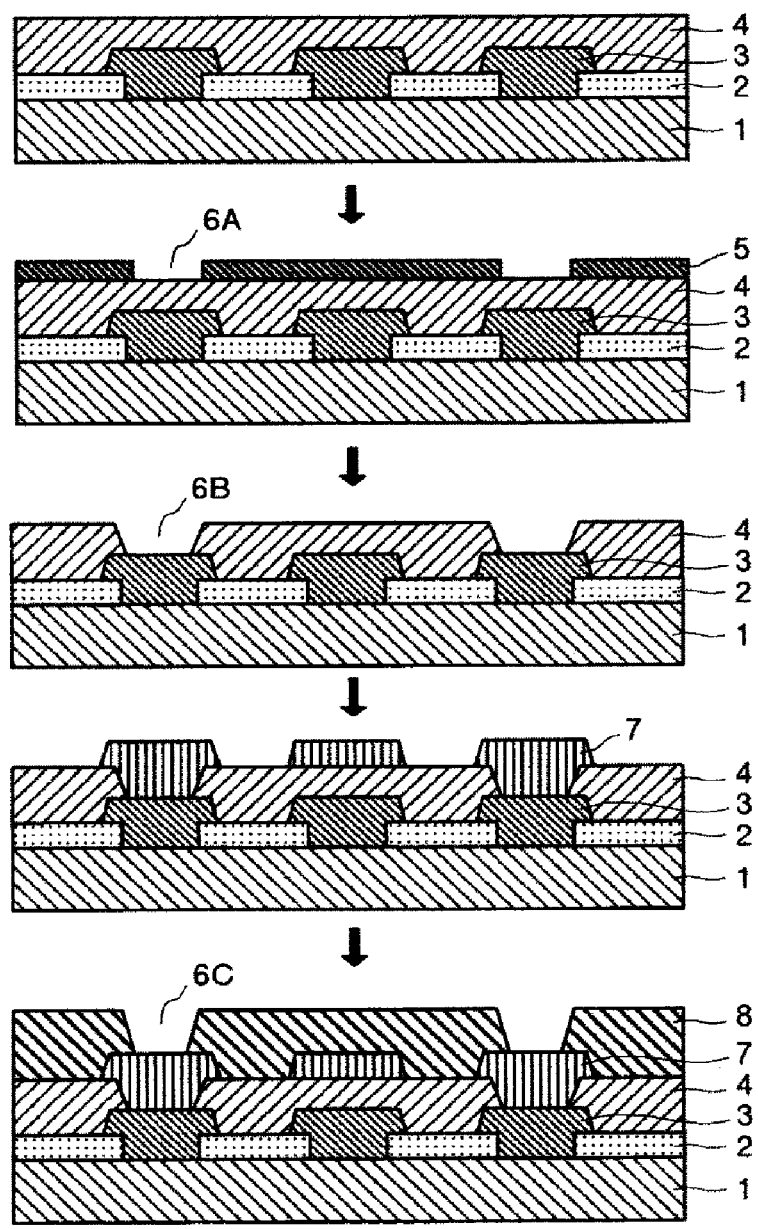

PHOTOSENSITIVE RESIN COMPOSITION, METHOD FOR PRODUCING PATTERNED CURED FILM, CURED FILM, INTERLAYER INSULATING FILM, COVER COAT LAYER, SURFACE PROTECTIVE FILM, AND ELECTRONIC COMPONENT

CROSS-REFERENCE TO RELATED APPLICATIONS

This application is a U.S. national phase application filed under 35 U.S.C. § 371 of International Application No. PCT/JP2019/030771, filed Aug. 5, 2019, designating the United States, which claims priority from International Application No. PCT/JP2018/029468, filed Aug. 6, 2018, which are hereby incorporated herein by reference in their entirety.

TECHNICAL FIELD

The invention relates to a photosensitive resin composition, a method for producing a patterned cured film, a cured film, an interlayer insulating film, a cover coat layer, a surface protective film, and an electronic component.

BACKGROUND ART

In the past, polyimide or polybenzoxazole having excellent heat resistance, electrical characteristics, mechanical characteristics at the same time, and the like has been used for the surface protective film and the interlayer insulating film of semiconductor elements. In recent years, a photosensitive resin composition in which photosensitive characteristics are imparted to these resins itself has been used, and by using this photosensitive resin composition, the producing process of a patterned cured film can be simplified, and a complicated producing process can be shortened (for example, refer to Patent Document 1).

In recent years, the miniaturization of transistors which has supported the enhancement of the performance of computers has faced the limit of scaling law, and a stacked device structure in which semiconductor elements are three-dimensionally stacked for further enhancement of the performance and speed has attracted attention (for example, refer to Non-Patent Document 1). Among the stacked device structures, the multi-die fan-out wafer level package (Multi-die Fanout Wafer Level Packaging) is a package that collectively seals a plurality of dies in one package, and has attracted attention because it can be expected to have lower costs and higher performance than conventionally proposed fan-out wafer level packages (manufactured by sealing one die in one package).

In the production of the multi-die fan-out wafer level package, the exposure time of the stepper has been prolonged with the increase in the size of the wafer. Accordingly, there is a need to increase the sensitivity of the photosensitive material from the viewpoint of improving the efficiency of the exposure step.

For example, Patent Document 2 discloses a negative photosensitive resin composition comprising a particular amide compound.

RELATED ART DOCUMENTS

Patent Documents

Patent Document 1: JP-A-2009-265520
Patent Document 2: JP-A-2016-079340

Non-Patent Document

Non-Patent Document 1: "Semiconductor Technical Yearbook 2013 Part: Packaging/Mounting," Nikkei BP, Inc., December 2012, p41-50.

SUMMARY OF THE INVENTION

However, the conventional photosensitive resin composition did not have sufficient photosensitivity. It is an object of the invention to provide a photosensitive resin composition having excellent sensitivity, a method for producing a patterned cured film using the same, a cured film, an interlayer insulating film, a cover coat layer, a surface protective film, and an electronic component.

As a result of extensive studies in view of the above problems, the inventors have found that a photosensitive resin composition having high photosensitivity can be obtained by combining a polyimide precursor having a polymerizable unsaturated bond with a specific photopolymerization initiator and a compound having a specific structure, thereby completing the invention.

According to the invention, the following photosensitive resin composition and the like are provided.

1. A photosensitive resin composition comprising:
   (A) a polyimide precursor having a polymerizable unsaturated bond;
   (B) one or more selected from compounds represented by any of the following formulas (1) to (4); and
   (C) a photopolymerization initiator represented by the following formula (11):

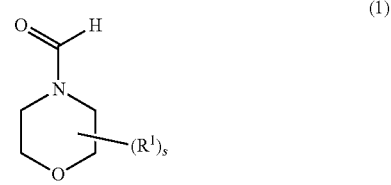

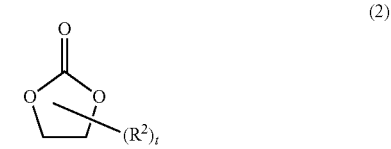

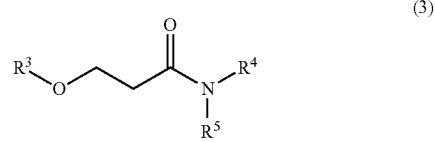

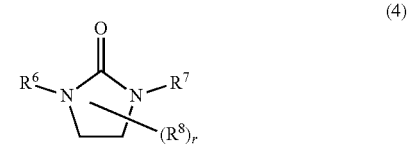

wherein in the formulas (1) to (4), $R^1$, $R^2$, and $R^8$ are independently an alkyl group including 1 to 4 carbon atoms, and $R^3$ to $R^7$ are independently a hydrogen atom, or an alkyl group including 1 to 4 carbon atoms; s is an integer of 0 to 8; t is an integer of 0 to 4; r is an integer of 0 to 4;

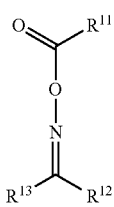

(11)

wherein in the formula (11), $R^{11}$ is an alkyl group including 1 to 12 carbon atoms, an alkoxy group including 1 to 12 carbon atoms, a cycloalkyl group including 4 to 10 carbon atoms, a phenyl group, or a tolyl group; $R^{12}$ is an alkyl group including 1 to 12 carbon atoms, a cycloalkyl group including 4 to 10 carbon atoms, a phenyl group, or a tolyl group; and $R^{13}$ is a substituted or unsubstituted benzoyl group, a substituted or unsubstituted fluorenyl group, or a substituted or unsubstituted carbazolyl group.

2. The photosensitive resin composition according to 1, wherein the component (A) is a polyimide precursor having a structural unit represented by the following formula (21):

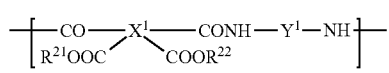

(21)

wherein in the formula (21), $X^1$ is a tetravalent aromatic group; $Y^1$ is a divalent aromatic group; $R^{21}$ and $R^{22}$ are independently a hydrogen atom, a group represented by the following formula (22), or an aliphatic hydrocarbon group including 1 to 4 carbon atoms; at least one of $R^{21}$ and $R^{22}$ is a group represented by the following formula (22); —COOR$^{21}$ group and —CO— group are on the ortho-position to each other; and —COOR$^{22}$ group and —CONH— group are on the ortho-position to each other;

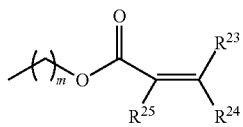

(22)

wherein in the formula (22), $R^{23}$ to $R^{25}$ are independently a hydrogen atom or an aliphatic hydrocarbon group including 1 to 3 carbon atoms; and m is an integer of 1 to 10.

3. The photosensitive resin composition according to 1 or 2, which comprises at least the compound represented by the formula (3) as the component (B).

4. The photosensitive resin composition according to any one of 1 to 3, comprising the component (B) in an amount of from 10 to 10000 parts by mass based on 100 parts by mass of the component (A).

5. The photosensitive resin composition according to any one of 1 to 4, further comprising (D) a cross-linking agent.

6. The photosensitive resin composition according to any one of 1 to 5, further comprising (E) a thermal polymerization initiator.

7. A method for manufacturing the patterned cured film comprising:

applying the photosensitive resin composition according to any one of 1 to 6 on a substrate, followed by drying the photosensitive resin composition to form a photosensitive resin film;

subjecting the photosensitive resin film to pattern-exposure to obtain a resin film;

developing the resin film after the pattern exposure using an organic solvent to obtain a patterned resin film; and heat-treating the patterned resin film.

8. The method for producing a patterned cured film according to 7, wherein a temperature of the heat treatment is 200° C. or lower.

9. A cured film obtained by curing the photosensitive resin composition according to any one of 1 to 6.

10. The cured film according to 9, which is a patterned cured film.

11. An interlayer insulating film, a cover coat layer, or a surface protective film manufactured by using the cured film according to 9 or 10.

12. An electronic component comprising the interlayer insulating film, the cover coat layer, or the surface protective film according to 11.

According to the invention, there can be provided a photosensitive resin composition having excellent sensitivities, a process for producing a patterned cured film using the same, a cured film, an interlayer insulating film, a cover coat layer, a surface protective film, and an electronic component.

BRIEF DESCRIPTION OF THE DRAWINGS

FIG. 1 is a schematic diagram showing a manufacturing process of an electronic component according to an embodiment of the invention.

MODE FOR CARRYING OUT THE INVENTION

Embodiments of a photosensitive resin composition, a method for producing a patterned cured film, a cured film, an interlayer insulating film, a cover coat layer, a surface protective film, and an electronic component of the invention will be described below in detail. The invention is not limited to the following embodiments.

In the specification, "A or B" may include either or both of A and B. Moreover, the term "step" in the specification includes not only an independent step, but also a step if the expected action of the step is achieved, even when the step is not clearly distinguishable from other steps. In the specification, a numeric value range represented by using "to" indicates the range including numeric values described before and after "to" as a minimum value and a maximum value, respectively. When a plurality of materials corresponding to each component exist in a composition, unless otherwise specified, a content of each component in the composition in the specification means a total amount of the plurality of materials existing in the composition. In the specification, unless otherwise specified, materials listed as examples may be used alone or in combination of two or more. The term "(meth)acrylic group" in this specification means "acrylic group" and "methacrylic group."

[Photosensitive Resin Composition]

The photosensitive resin composition of the invention contains: (A) a polyimide precursor having a polymerizable unsaturated bond (hereinafter also referred to as "component (A)"), (B) one or more selected from compounds represented by any of the following formulas (1) to (4) (hereinafter also referred to as "component (B)"), and (C) a photopolymerization initiator represented by the following formula (11) (hereinafter also referred to as a "component (C)"). The photosensitive resin composition of the invention is preferably a negative photosensitive resin composition.

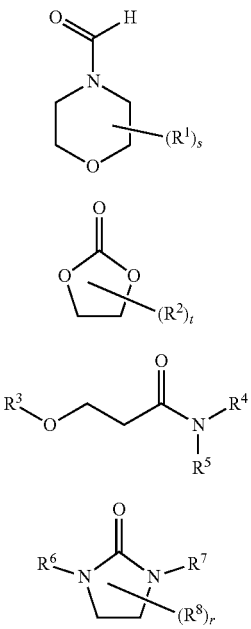

In the formulas (1) to (4), $R^1$, $R^2$, and $R^8$ are independently an alkyl group including 1 to 4 carbon atoms, and $R^3$ to $R^7$ are independently a hydrogen atom, or an alkyl group including 1 to 4 carbon atoms; s is an integer of 0 to 8; t is an integer of 0 to 4; r is an integer of 0 to 4.

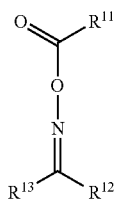

In the formula (11), $R^{11}$ is an alkyl group including 1 to 12 carbon atoms, an alkoxy group including 1 to 12 carbon atoms, a cycloalkyl group including 4 to 10 carbon atoms, a phenyl group, or a tolyl group; $R^{12}$ is an alkyl group including 1 to 12 carbon atoms, a cycloalkyl group including 4 to 10 carbon atoms, a phenyl group, or a tolyl group; and $R^{13}$ is a substituted or unsubstituted benzoyl group, a substituted or unsubstituted fluorenyl group, or a substituted or unsubstituted carbazolyl group.

The photosensitive resin composition of the invention has higher photosensitivity as compared with the conventional photosensitive resin composition by containing the above components. In other words, a pattern having a high residual film ratio can be obtained with a small amount of exposure.

Hereinafter, each component will be described.

(Component (A): Polyimide Precursor Having Polymerizable Unsaturated Bond)

The component (A) is not particularly limited as long as it is a polyimide precursor having a polymerizable unsaturated bond, but a polyimide precursor having a high transmittance when an i-ray is used as a light source for pattern exposure and exhibiting a high cured film characteristic even when cured at a low temperature of 200° C. or lower is preferable.

Examples of the polymerizable unsaturated bond include a double bond between carbon atoms and the like.

The component (A) is preferably a polyimide precursor having a structural unit represented by the following formula (21). The structural unit can make the transmittance of the i-ray to be high, and can give a satisfactory cured film even when curing is performed at a low temperature of 200° C. or lower.

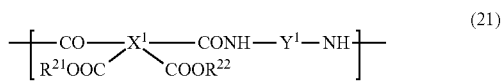

In the formula (21), $X^1$ is a tetravalent aromatic group; $Y^1$ is a divalent aromatic group; $R^{21}$ and $R^{22}$ are independently a hydrogen atom, a group represented by the following formula (22), or an aliphatic hydrocarbon group including 1 to 4 carbon atoms; at least one of $R^{21}$ and $R^{22}$ is the group represented by the following formula (22); —COOR$^{21}$ group and —CO— group are on the ortho-position to each other; and —COOR$^{22}$ group and —CONH— group are on the ortho-position to each other.

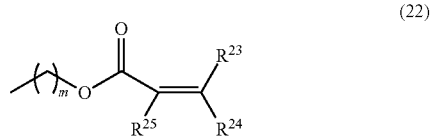

In the formula (22), $R^{23}$ to $R^{25}$ are independently a hydrogen atom or an aliphatic hydrocarbon group including 1 to 3 carbon atoms; and m is an integer of 1 to 10 (preferably an integer of 2 to 10, more preferably an integer of 2 to 5, and still more preferably 2 or 3).

The tetravalent aromatic group for $X^1$ may be a tetravalent group including an aromatic hydrocarbon structure (including, for example, 6 to 20 carbon atoms), and may be a tetravalent group including an aromatic heterocyclic ring structure (including, for example, 5 to 20 atoms). $X^1$ is preferably a tetravalent group including an aromatic hydrocarbon structure.

Examples of the tetravalent group including an aromatic hydrocarbon structure for $X^1$ include, but are not limited to, the following groups, for example.

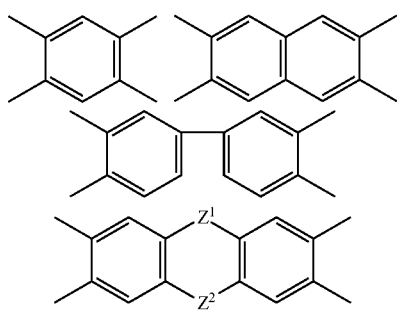

-continued

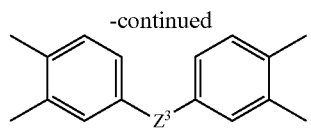

In the formulas, $Z^1$ and $Z^2$ are independently a divalent group the divalent group being not conjugated with the benzene rings bonding thereto, or a single bond; $Z^3$ is an ether-bond (—O—) or a sulfide bond (—S—).

The divalent group for $Z^1$ and $Z^2$ are preferably —O—, —S—, a methylene group, bis(trifluoromethyl)methylene group, or a difluoromethylene group, and more preferably-O
$Z^3$ is preferably —O—.

The divalent aromatic group for $Y^1$ may be a divalent aromatic hydrocarbon group (including, for example, 6 to 20 carbon atoms), or a divalent aromatic heterocyclic group (including, for example, 5 to 20 atoms). $Y^1$ is preferably a divalent aromatic hydrocarbon group.

The divalent aromatic hydrocarbon groups for $Y^1$ include, but are not limited to, a group represented by the following formula (23).

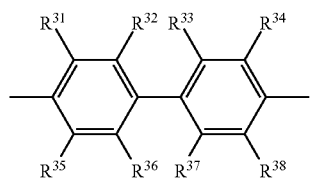

In the formula (23), $R^{31}$ to $R^{38}$ are independently a hydrogen atom, a monovalent aliphatic hydrocarbon group, or a monovalent organic group having a halogen atom.

The monovalent aliphatic hydrocarbon group for $R^{31}$ to $R^{38}$ (preferably including 1 to 10 carbon atoms, more preferably including 1 to 6 carbon atoms) is preferably a methyl group.

The monovalent organic group having a halogen atom (preferably a fluorine atom) for $R^{31}$ to $R^{38}$ is preferably a monovalent aliphatic hydrocarbon group (preferably including 1 to 10 carbon atoms, more preferably including 1 to 6 carbon atoms), and more preferably a trifluoromethyl group.

In the formula (23), for example, $R^{32}$ and $R^{33}$ may be a monovalent aliphatic hydrocarbon group (e.g., a methyl group), and $R^{31}$ and $R^{34}$ to $R^{38}$ may be hydrogen atoms.

Examples of the aliphatic hydrocarbon group including 1 to 4 (preferably 1 or 2) carbon atoms for $R^{21}$ and $R^{22}$ in the formula (21) include a methyl group, an ethyl group, an n-propyl group, a 2-propyl group, an n-butyl group, and the like.

In the formula (21), at least one of $R^{21}$ and $R^{22}$ is the group represented by the formula (22), and preferably both of $R^{21}$ and $R^{22}$ are groups represented by the formula (22).

Examples of the aliphatic hydrocarbon group including 1 to 3 (preferably 1 or 2) carbon atoms for $R^{23}$ to $R^{25}$ in the formula (22) include a methyl group, an ethyl group, an n-propyl group, a 2-propyl group, and the like. A methyl group is preferable.

The polyimide precursor having a structural unit represented by the formula (21) can be produced, for example, by reacting a tetracarboxylic dianhydride represented by the following formula (24) and a diamino compound represented by the following formula (25) in an organic solvent such as N-methyl-2-pyrrolidone (hereinafter referred to as "NMP") to produce a polyamic acid, and adding a compound represented by the following formula (26), and reacting in an organic solvent to introduce ester groups in whole or partially to the polyamic acid.

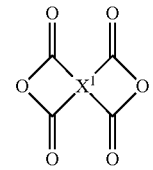

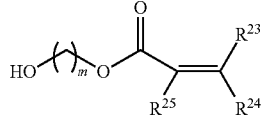

In the formula (24), $X^1$ is as defined in the formula (21). In the formula (25), $Y^1$ is as defined in the formula (21). In the formula (26), $R^{23}$ to $R^{25}$ and m are as defined in the formula (22).

The tetracarboxylic dianhydride represented by the formula (24) and the diamino compound represented by the formula (25) may be used alone or in combination of two or more.

The content of the structural unit represented by the formula (21) is preferably 50 mol % or more, more preferably 80 mol % or more, based on the total moles of the structural unit of the component (A). The upper limit is not particularly limited, and may be 100 mol %.

The component (A) may contain a structural unit other than the structural unit represented by the formula (21). Examples of the structural unit other than the structural unit represented by the formula (21) include a structural unit represented by the following formula (27).

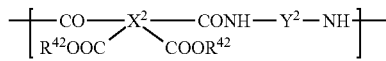

In the formula (27), $X^2$ is a tetravalent aromatic group; $Y^2$ is a divalent aromatic group; $R^{41}$ and $R^{42}$ are independently a hydrogen atom or an aliphatic hydrocarbon group including 1 to 4 carbon atoms; —COOR$^{42}$ group and —CONH— group are on the ortho-position to each other; and —COOR$^{41}$ group and —CO— group are on the ortho-position to each other.

Examples of the tetravalent aromatic group for $X^2$ in the formula (27) include the same group as the tetravalent aromatic group for $X^1$ in the formula (21). Examples of the divalent aromatic group for $Y^2$ include the same group as the divalent aromatic group for $Y^1$ in the formula (21). Examples of the aliphatic hydrocarbon group including 1 to 4 carbon atoms for $R^{41}$ and $R^{42}$ include the same group as the aliphatic hydrocarbon group including 1 to 4 carbon atoms for $R^{21}$ and $R^{22}$ in the formula (21).

The content of the structural unit other than the structural unit represented by the formula (21) is preferably less than 50 mol %, based on the total moles of the structural unit contained in the component (A).

The structural unit other than the structural unit represented by the formula (21) may be alone or in the combination of two or more.

In the component (A), the ratio of the carboxy group esterified with the group represented by the formula (22), based on the total moles of the carboxy group and the total moles of the carboxy ester in the polyimide precursor, is preferably 50 mol % or more, more preferably 60 to 100 mol %, and still more preferably 70 to 90 mol %.

The molecular weight of the component (A) is not particularly limited, but the number average molecular weight is preferably 10,000 to 200,000.

The number average molecular weight is measured by a gel permeation chromatography (GPC) method, and is calculated by conversion using a standard polystyrene calibration curve. Specifically, the measurement is performed by the method described in Examples.

(Component (B): one or more selected from compounds represented by any of the formulas (1) to (4))

The photosensitive resin composition of the invention has high photosensitivity by containing one or more selected from compounds represented by any of the formulas (1) to (4) as the component (B).

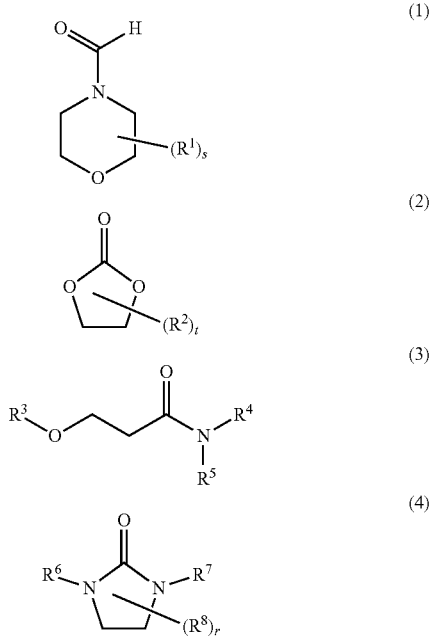

In the formulas (1) to (4), $R^1$, $R^2$, and $R^8$ are independently an alkyl group including 1 to 4 carbon atoms, $R^3$ to $R^7$ are independently a hydrogen atom, or an alkyl group including 1 to 4 carbon atoms; s is an integer of 0 to 8; t is an integer of 0 to 4; and r is an integer of 0 to 4.

In the formula (1), s is preferably 0.

In the formula (2), the alkyl group including 1 to 4 carbon atoms for $R^2$ is preferably a methyl group or an ethyl group. t is preferably 0, 1, or 2 (more preferably 1).

In the formula (3), the alkyl group including 1 to 4 carbon atoms for $R^3$ is preferably a methyl group, an ethyl group, a propyl group, or a butyl group. The alkyl group including 1 to 4 carbon atoms for $R^4$ and $R^5$ is preferably a methyl group or an ethyl group.

In the formula (4), the alkyl group including 1 to 4 carbon atoms of $R^8$ to $R^8$ is preferably a methyl group or an ethyl group. r is preferably 0 or 1 (more preferably 0).

The component (B) may be, for example, one or more selected from compounds represented by any of the formula (1), (3), and (4), or may be the compound represented by the formula (3).

As the component (B), for example, the following compounds can be used.

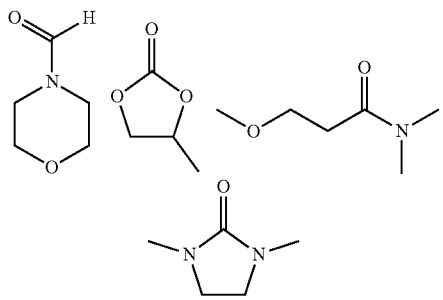

The content of the component (B) is ordinarily 10 to 10000 parts by mass, preferably 10 to 1000 parts by mass, and more preferably 10 to 500 parts by mass, based on 100 parts by mass of the component (A).

(Solvent)

The photosensitive resin composition of the invention may contain a solvent (e.g., an organic solvent). Such a solvent is not particularly limited, and those commonly used can be used, and specific examples thereof include the following solvents.

Examples of the esters include ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, γ-butyrolactone, ε-caprolactone, δ-valerolactone, alkyl alkoxy acetate (e.g., methyl alkoxy acetate, ethyl alkoxy acetate, and butyl alkoxy acetate (e.g., methyl methoxyacetate, ethyl methoxyacetate, butyl methoxyacetate, methyl ethoxyacetate, and ethyl ethoxyacetate), 3-alkoxypropionate alkyl esters (e.g., methyl 3-alkoxypropionate, ethyl 3-alkoxypropionate (e.g., methyl 3-methoxypropionate, ethyl 3-methoxypropionate, methyl 3-ethoxypropionate, and ethyl 3-ethoxypropionate)), 2-alkoxypropionate alkyl esters (e.g., methyl 2-alkoxypropionate, ethyl 2-alkoxypropionate, propyl 2-alkoxypropionate (e.g., methyl 2-methoxypropionate, ethyl 2-methoxypropionate, propyl 2-methoxypropionate, methyl 2-ethoxypropionate, and ethyl 2-ethoxypropionate)), methyl 2-alkoxy-2-methylpropionate, ethyl 2-alkoxy-2-methylpropionate (e.g., methyl 2-methoxy-2-methylpropionate, and ethyl 2-ethoxy-2-methylpropionate), methyl pyruvate, ethyl pyruvate, propyl pyruvate, methyl acetoacetate, ethyl acetoacetate, methyl 2-oxobutanoate, ethyl 2-oxobutanoate, and the like.

Examples of the ethers include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, and the like.

Examples of the ketones include methyl ethyl ketone, cyclohexanone, cyclopentanone, 2-heptanone, 3-heptanone, and NMP, and the like.

Examples of the aromatic hydrocarbons include toluene, xylene, anisole, limonene, and the like.

Examples of the sulfoxides include dimethylsulfoxide and the like.

Preferred examples of the solvent include γ-butyrolactone, cyclopentanone, and ethyl lactate, and the like.

The content of NMP in the photosensitive resin composition of the invention may be, for example, 1% by mass or less (or 3 parts by weight or less based on 100 parts by mass of the component (A). Further, the content of NMP may be 0% by mass (no NMP is contained). In this way, toxicity, such as reproductive toxicity, can be reduced.

Since the component (B) can dissolve other components of the photosensitive resin composition of the invention to form a varnish, the above-mentioned solvent may be used or may not be used. The content of the component (B) when the above-mentioned solvent is used is, for example, 5 to 100% by mass based on the total amount of the component (B) and the solvent, and may be 5 to 50% by mass based on the total amount of the component (B) and the solvent. In addition, the content of the component (B) when the above-mentioned solvent is used is, for example, 10 to 1000 parts by mass based on 100 parts by mass of the component (A), and may be 10 to 100 parts by mass based on 100 parts by mass of the component (A), or 10 to 50 parts by mass based on 100 parts by mass of the component (A). Even if the content of the component (B) is small (e.g., 5 to 50% by mass based on the total amount of the component (B) and the solvent, or 10 to 50 parts by mass based on 100 parts by mass of the component (A), the sensitivity of photosensitive resin composition of the invention can be increased.

(Component (C): Photopolymerization Initiator Represented by the Formula (11)

By containing the photopolymerization initiator represented by the formula (11), the photosensitive resin composition of the invention has higher photosensitivity due to the synergistic effect with the component (B).

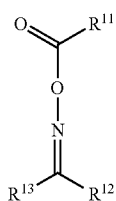

(11)

In the formula (11), $R^{11}$ is an alkyl group including 1 to 12 carbon atoms, an alkoxy group including 1 to 12 carbon atoms, a cycloalkyl group including 4 to 10 carbon atoms, a phenyl group, or a tolyl group; $R^{12}$ is an alkyl group including 1 to 12 carbon atoms, a cycloalkyl group including 4 to 10 carbon atoms, a phenyl group, or a tolyl group; and $R^{13}$ is a substituted or unsubstituted benzoyl group, a substituted or unsubstituted fluorenyl group, or a substituted or unsubstituted carbazolyl group.

$R^{11}$ and $R^{12}$ are preferably independently an alkyl group including 1 to 8 carbon atoms, a cycloalkyl group including 4 to 6 carbon atoms, a phenyl group, or a tolyl group, more preferably an alkyl group including 1 to 4 carbon atoms, a cycloalkyl group including 4 to 6 carbon atoms, a phenyl group, or a tolyl group, and more preferably a methyl group, a cyclopentyl group, a phenyl group, or a tolyl group.

$R^{13}$ is preferably the group corresponding to $R^{13}$ in the formula (11) contained in compounds represented by any of formulas (14) to (20) described later.

Examples of the substituent of a substituted or unsubstituted benzoyl group, a substituted or unsubstituted fluorenyl group, or a substituted or unsubstituted carbazolyl group (hereinafter also referred to as arbitrary substituent) include a phenylthio group, an ethyloloxy group, an alkyl group including 1 to 20 carbon atoms (e.g., a methyl group, an ethyl group, and an n-propyl group), an alkoxy group including 1 to 20 (preferably 1 to 10, more preferably 1 to 8) carbon atoms which may be halogenated (preferably fluorinated), a (2,2-dimethyl-1,3-dioxolane-4-yl)methoxy group, a benzoyl group, and the like.

The arbitrary substituent may further have an arbitrary substituent described above.

From the viewpoint of increasing photocurability, the component (C) is preferably a compound represented by the following formula (12) or formula (13).

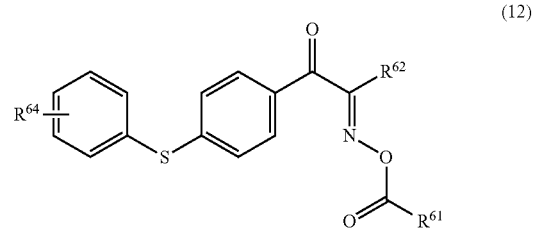

(12)

In the formula (12), $R^{61}$ and $R^{62}$ are the same as $R^{11}$ and $R^{12}$ in the formula (11).

$R^{64}$ is —H, —OH, —COOH, —O(CH$_2$)OH, —O(CH$_2$)$_2$OH, —COO(CH$_2$)OH, or —COO(CH$_2$)$_2$OH; preferably —H, —O(CH$_2$)OH, —O(CH$_2$)$_2$OH, —COO(CH$_2$)OH, or —COO(CH$_2$)$_2$OH; and more preferably —H, —O(CH$_2$)$_2$OH, or —COO(CH$_2$)$_2$OH.

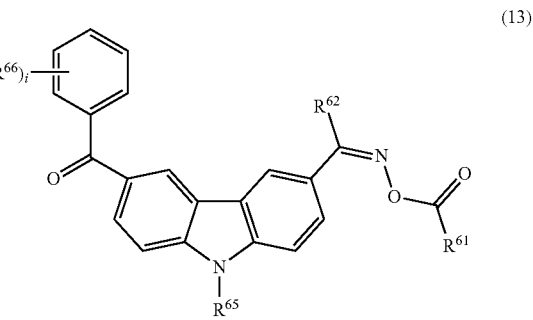

(13)

In the formula (13), $R^{61}$ and $R^{62}$ are the same as $R^{11}$ and $R^{12}$ in the formula (11).

$R^{65}$ is an alkyl group including 1 to 6 carbon atoms, and is preferably an ethyl group. $R^{66}$ is an alkyl group including 1 to 12 carbon atoms or an organic group having an acetal bond, and is preferably a methyl group, or a substituent corresponding to $R^{66}$ in the formula (13) which is possessed by a compound represented by the formula (17) described later. i is an integer of 1 to 3, preferably 1 or 2.

Examples of the compound represented by the formula (12) include a compound represented by the following formula (14) and a compound represented by the following formula (15). The compound represented by the following formula (14) is available as "IRGACURE OXE-01" (manufactured by BASF Japan Ltd.).

"IRGACURE OXE-02" (manufactured by BASF Japan Ltd.) and "ADEKA optomer N-1919" (manufactured by ADEKA CORPORATION), respectively.

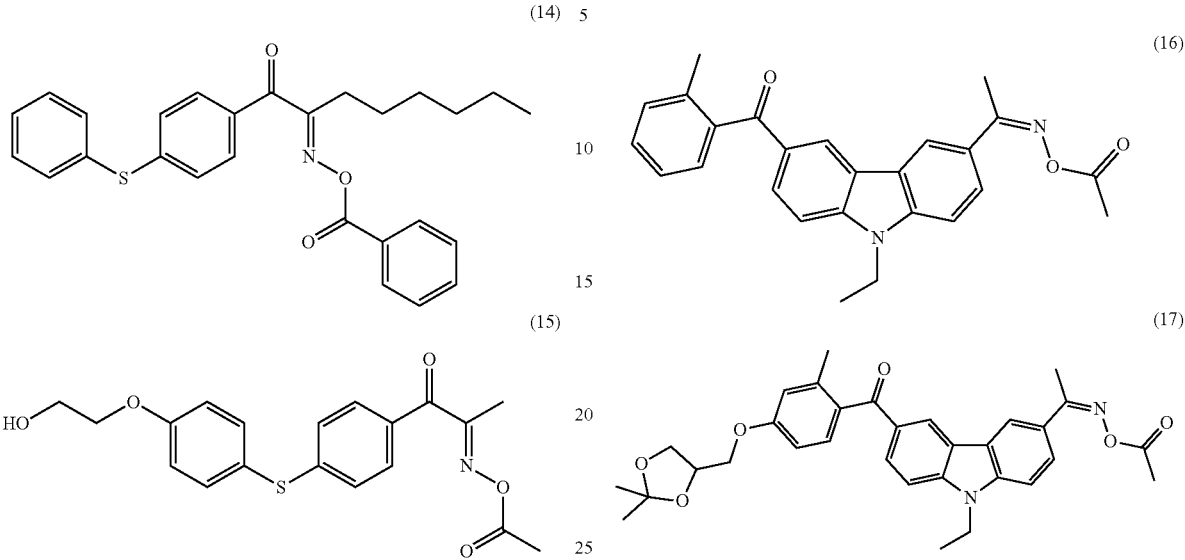

Examples of the compound represented by the formula (13) include, for example, a compound represented by the following formula (16) or (17), which are available as In addition, a compound represented by any of the following formulas (18) to (20) can also be used as the photopolymerization initiator of the component (C).

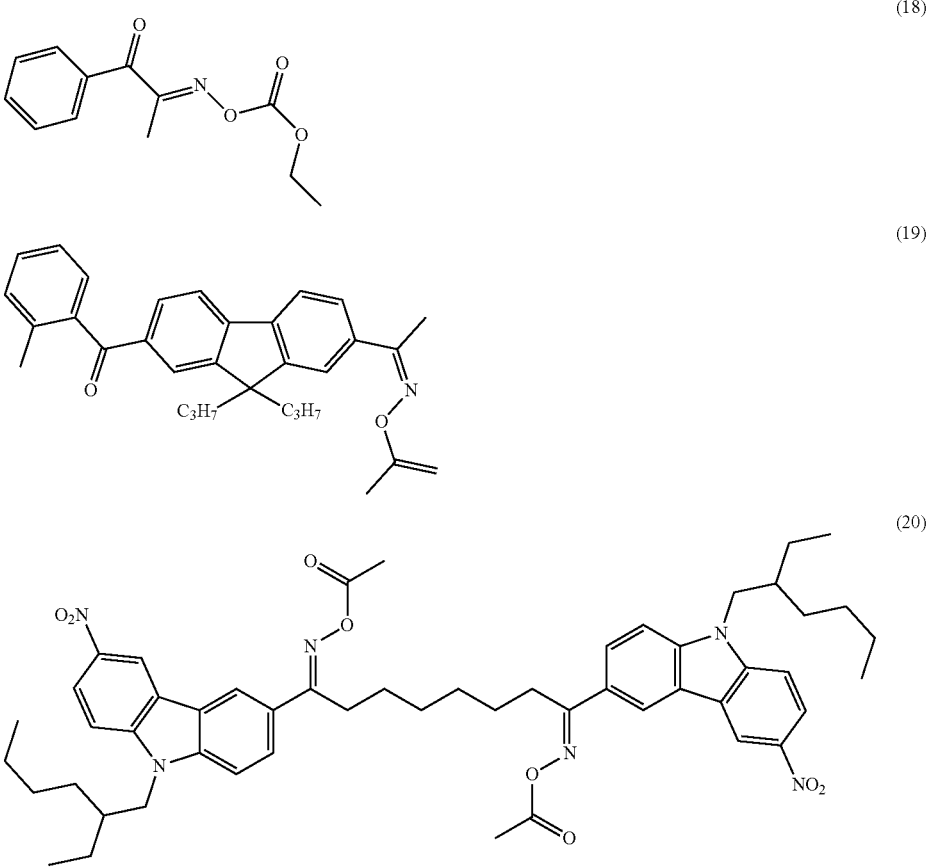

The content of the component (C) is preferably from 0.1 to 20 parts by mass, more preferably from 0.1 to 10 parts by mass, and still more preferably from 0.1 to 6 parts by mass, based on 100 parts by mass of the component (A). When it is within the above range, the photo crosslink tends to be the same extent in the film thickness direction, and a practical relief pattern can be easily obtained.

(Component (D): Cross-Linking Agent)

The photosensitive resin composition of the invention may further contain a cross-linking agent (hereinafter also referred to as a "component (D)").

The component (D) preferably has a polymerizable unsaturated double bond-containing group, and preferably has 2 to 6, more preferably 2 to 4, polymerizable unsaturated double bond-containing groups, for the purpose of increasing the cross-linking density and the photosensitivity and suppressing the swelling of the pattern after development. The component (D) is preferably a compound having a (meth)acrylic group polymerizable by a photopolymerization initiator.

Examples of the component (D) include diethylene glycol di(meth)acrylate, triethylene glycol di(meth)acrylate, tetraethylene glycol di(meth)acrylate, trimethylolpropane di(meth)acrylate, trimethylolpropane tri(meth)acrylate, 1,4-butanediol di(meth)acrylate, 1,6-hexanediol di(meth)acrylate, pentaerythritol tri(meth)acrylate, pentaerythritol tetra(meth) acrylate, ethoxylated pentaerythritol tetra(meth)acrylate, styrene, divinylbenzene, 4-vinyltoluene, 4-vinylpyridine, N-vinylpyrrolidone, 2-hydroxyethyl (meth)acrylate, 1,3-(meth)acryloyloxy-2-hydroxypropane, methylenebisacrylamide, N,N-dimethylacrylamide, N-methylolacrylamide, tricyclodecanedimethanol diacrylate, and the like.

It is preferable that the component (D) have a polymerizable unsaturated double bond-containing group and further have an aliphatic cyclic skeleton (including preferably 4 to 15, more preferably 5 to 12 carbon atoms). By the use of the component (D), hydrophobicity can be imparted to a cured product to be formed, and the decrease in adhesion between the cured product and a substrate under high temperature and high humidity conditions can be suppressed.

The component (D) preferably contains a cross-linking agent represented by the following formula (31).

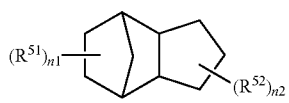

(31)

In the formula (31), $R^{51}$ and $R^{52}$ are independently an aliphatic hydrocarbon group having 1 to 4 carbon atoms or a group represented by the following formula (32); n1 is 0 or 1, n2 is an integer of 0 to 2, and the sum of n1 and n2 is 1 or more (preferably 2 or 3); and at least one (preferably 2 or 3) of n1 $R^{51}$'s and n2 $R^{52}$'s is a group represented by the following formula (32).

When two $R^{52}$'s are present, the two $R^{52}$'s may be the same or different.

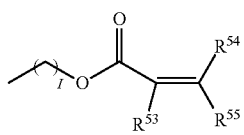

(32)

In the formula (32), $R^{53}$ to $R^{55}$ are independently a hydrogen atom or an aliphatic hydrocarbon group including 1 to 3 carbon atoms, and l is an integer of 0 to 10 (preferably 0, 1, or 2).

Examples of the aliphatic hydrocarbon group including 1 to 4 carbon atoms for $R^{51}$ in the formula (31) and $R^{52}$ include the same group as the aliphatic hydrocarbon group including 1 to 4 carbon atoms for $R^{21}$ and $R^{22}$ in the formula (21).

The content of the component (D) when the component (D) is contained is preferably from 1 to 100 parts by mass, more preferably from 1 to 75 parts by mass, and still more preferably from 1 to 50 parts by mass, based on 100 parts by mass of the component (A).

(Component (E): Thermal Polymerization Initiator)

The photosensitive resin composition of the invention may further contain a thermal polymerization initiator (hereinafter also referred to as a "component (E)").

As the component (E), a compound which does not decompose by heating (drying) for removing a solvent at the time of film formation of the photosensitive resin film, but decomposes by heating at the time of curing to generate radicals, and accelerates the polymerization reaction of the component (D) with each other or between the component (A) and the component (D) is preferable. Therefore, the component (E) is preferably a compound having a decomposition point of 110° C. or higher and 200° C. or lower, and from the viewpoint of promoting the polymerization reaction at a lower temperature, a compound having a decomposition point of 110° C. or higher and 175° C. or lower is more preferable.

Examples of the component (E) include bis(1-phenyl-1-methylethyl) peroxide and the like.

When the component (E) is contained, the content of the component (E) is preferably 0.5 to 20 parts by mass, more preferably 1 to 20 parts by mass, and from the viewpoint of suppressing a decrease in solubility due to decomposition at the time of drying, still more preferably from 1 to 10 parts by mass, based on 100 parts by mass of the component (A).

(Other Components)

In addition to the above components, the photosensitive resin composition of the present invention may comprise a coupling agent, a surfactant, a leveling agent, a rust inhibitor, a polymerization inhibitor, and the like.

(Coupling Agent)

The coupling agent reacts and crosslinks with the component (A) during the heat treatment after development, or the coupling agent itself polymerizes in the heat treatment step. As a result, it is possible to further increase the adhesiveness between the obtained cured film and a substrate.

As the coupling agent, a silane coupling agent is preferred.

Examples of preferred silane coupling agents include compounds having an urea bond (—NH—CO—NH—). By the use of the coupling agent, even when curing is performed at a low temperature of 200° C. or lower, the adhesiveness of the obtained cured film to a substrate can be further enhanced.

The compound represented by the following formula (41) is more preferable from the viewpoint of excellent manifestation of adhesiveness when curing is performed at a low temperature.

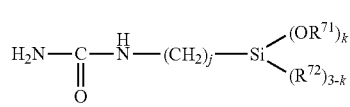

(41)

In the formula (41), $R^{71}$ and $R^{72}$ are independently an alkyl group including 1 to 5 carbon atoms; j is an integer of 1 to 10, and k is an integer of 1 to 3.

Specific examples of the compound represented by the formula (41) include ureidomethyltrimethoxysilane, ureidomethyltriethoxysilane, 2-ureidoethyltrimethoxysilane, 2-ureidoethyltriethoxysilane, 3-ureidopropyltrimethoxysilane, 3-ureidopropyltriethoxysilane, 4-ureidobutyltrimethoxysilane, 4-ureidobutyltriethoxysilane, and the like; and 3-ureidopropyltriethoxysilane is preferable.

As the silane coupling agent, a silane coupling agent having a hydroxy group or a glycidyl group may be used. When a silane coupling agent having a hydroxy group or a glycidyl group and a silane coupling agent having a urea bond in the molecular are used in combination, the adhesiveness of the cured film to a substrate when cured at a low temperature can be further increased.

Examples of silane coupling agent having a hydroxy group or a glycidyl group include methylphenylsilanediol, ethylphenylsilanediol, n-propylphenylsilanediol, isopropylphenylsilanediol, n-butylphenylsilanediol, isobutylphenylsilanediol, tert-butylphenylsilanediol, diphenylsilanediol, ethylmethylphenylsilanol, n-propylmethylphenylsilanol, isopropylmethylphenylsilanol, n-butylmethylphenylsilanol, isobutylmethylphenylsilanol, tert-butylmethylphenylsilanol, ethyl-n-propylphenylsilanol, ethylisopropylphenylsilanol, n-butylethylphenylsilanol, isobutylethylphenylsilanol, tert-butylethylphenylsilanol, methyldiphenylsilanol, ethyldiphenylsilanol, n-propyldiphenylsilanol, isopropyldiphenylsilanol, n-butyldiphenylsilanol, isobutyldiphenylsilanol, tert-butyldiphenylsilanol, phenylsilanetriol, 1,4-bis(trihydroxysilyl)benzene, 1,4-bis(methyldihydroxysilyl)benzene, 1,4-bis(ethyldihydroxysilyl)benzene, 1,4-bis(propyldihydroxysilyl)benzene, 1,4-bis(butyldihydroxysilyl)benzene, 1,4-bis(dimethylhydroxysilyl)benzene, 1,4-bis(diethylhydroxysilyl)benzene, 1,4-bis(dipropylhydroxysilyl)benzene, 1,4-bis(dibutylhydroxysilyl)benzene, and a compound represented by the following formula (42). Among them, the compound represented by the formula (42) is particularly preferable, since it further increases the adhesiveness to a substrate.

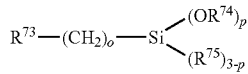
(42)

In the formula (42), $R^{73}$ is a monovalent organic group having a hydroxy group or a glycidyl group; $R^{74}$ and $R^{75}$ are independently an alkyl group including 1 to 5 carbon atoms; o is an integer of 1 to 10, and p is an integer of 1 to 3.

Examples of the compound represented by the formula (42) include hydroxymethyltrimethoxysilane, hydroxymethyltriethoxysilane, 2-hydroxyethyltrimethoxysilane, 2-hydroxyethyltriethoxysilane, 3-hydroxypropyltrimethoxysilane, 3-hydroxypropyltriethoxysilane, 4-hydroxybutyltrimethoxysilane, 4-hydroxybutyltriethoxysilane, glycidoxymethyltrimethoxysilane, glycidoxymethyltriethoxysilane, 2-glycidoxyethyltrimethoxysilane, 2-glycidoxyethyltriethoxysilane, 3-glycidoxypropyltrimethoxysilane, 3-glycidoxypropyltriethoxysilane, 4-glycidoxybutyltrimethoxysilane, 4-glycidoxybutyltriethoxysilane and the like.

The silane coupling agent having a hydroxy group or a glycidyl group preferably further has a group having a nitrogen atom (e.g., an amino group or an amide bond).

Examples of the silane coupling agent further having an amino group include bis(2-hydroxymethyl)-3-aminopropyltriethoxysilane, bis(2-hydroxymethyl)-3-aminopropyltrimethoxysilane, bis(2-glycidoxymethyl)-3-aminopropyltriethoxysilane, bis(2-hydroxymethyl)-3-aminopropyltrimethoxysilane, and the like.

Examples of the silane coupling agent further having an amide bond include a compound represented by the following formula (43).

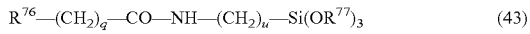
(43)

In the formula (43), $R^{78}$ is a hydroxy group or a glycidyl group, q and u are independently an integer of 1 to 3, and $R^{77}$ is a methyl group, an ethyl group, or a propyl group.

When a silane coupling agent is used, the content of the silane coupling agent is preferably 0.1 to 20 parts by mass, more preferably 0.3 to 10 parts by mass, and still more preferably 1 to 10 parts by mass, based on 100 parts by mass of the component (A).

(Surfactant or Leveling Agent)

By the addition of a surfactant or a leveling agent, coating property (for example, suppression of striation (unevenness in film thickness)) and developability can be increased.

Examples of the surfactant or the leveling agent include polyoxyethylene lauryl ether, polyoxyethylene stearyl ether, polyoxyethylene oleyl ether, polyoxyethylene octyl phenol ether, and the like. Examples of commercially available products include the trade names "MEGAFACE F171", "F173", "R-08" (manufactured by DIC Corporation), "Florard FC430", "FC431" (manufactured by 3M Japan Limited), "organosiloxane polymer KP341", "KBM303", "KBM403", and "KBM803" (manufactured by Shin-Etsu Chemical Co., Ltd.) and the like.

When the surfactant or the leveling agent is included, the content of the surfactant or the leveling agent is preferably 0.01 to 10 parts by mass, more preferably 0.05 to 5 parts by mass, and still more preferably 0.05 to 3 parts by mass, based on 100 parts by mass of the component (A).

(Rust Inhibitor)

By the addition of a rust inhibitor, corrosion of copper and copper alloy can be suppressed and discoloration of copper and copper alloy can be prevented.

Examples of the rust inhibitor include triazole derivatives, tetrazole derivatives, and the like.

When the rust inhibitor is added, the content of the rust inhibitor is preferably 0.01 to 10 parts by mass, more preferably 0.1 to 5 parts by mass, and more preferably 0.5 to 3 parts by mass, based on 100 parts by mass of the component (A).

(Polymerization Inhibitor)

By the addition of a polymerization inhibitor, good storage stability can be ensured.

Examples of the polymerization inhibitor include a radical polymerization inhibitor, a radical polymerization depressant, and the like.

Examples of the polymerization inhibitor include p-methoxyphenol, diphenyl-p-benzoquinone, benzoquinone, hydroquinone, pyrogallol, phenothiazine, resorcinol, orthodinitrobenzene, pallazinitrobenzene, methadinitrobenzene, phenanthraquinone, N-phenyl-2-naphthylamine, cuperone, 2,5-toluquinone, tannic acid, parabendylaminophenol, nitrosamines, and the like.

When the polymerization inhibitor is added, the content of the polymerization inhibitor is preferably 0.01 to 30 parts by mass, more preferably 0.01 to 10 parts by mass, and still more preferably 0.05 to 5 parts by mass, based on 100 parts by mass of the component (A), from the viewpoint of storage stability of the photosensitive resin composition and heat resistance of the cured film to be obtained.

The photosensitive resin composition of the invention may consist essentially of the components (A) to (C) and one or more components selected from the group consisting of a solvent, the component (D), the component (E), the coupling agent, the surfactant, the leveling agent, the rust inhibitor, and the polymerization inhibitor, and may contain unavoidable impurities in addition to the above-mentioned components, as long as the effect of the invention is not impaired.

For example, 80% by mass or more, 90% by mass or more, 95% by mass or more, 98% by mass or more, 99% by mass or more, 99.5% by mass by mass, 99.9% by mass or more or 100% by mass of the photosensitive resin composition of the present invention may consist of components (A) to (C),
components (A) to (C) and a solvent,
components (A) to (D) and a solvent,
components (A) to (E) and a solvent, or
components (A) to (C) and one or more components selected from the group consisting of a solvent, the component (D), the component (E), the coupling agent, the surfactant, the leveling agent, the rust inhibitor, and the polymerization inhibitor.

[Cured Film]

The cured film of the invention can be obtained by curing the above-mentioned photosensitive resin composition. The cured film of the invention may be used as a patterned cured film or as a pattern-less cured film. The thickness of the cured film of the invention is preferably 5 to 20 μm.

[Method for Producing a Patterned Cured Film]

The method for manufacturing a patterned cured film of the invention includes a step of applying the photosensitive resin composition on a substrate, followed by drying to form a photosensitive resin film, a step of subjecting the photosensitive resin film to pattern-exposure to obtain a resin film, a step of developing the resin film after pattern-exposure using an organic solvent to obtain a patterned resin film, and a step of heat-treating the patterned resin film. Thus, a patterned cured film can be obtained.

A method for producing a cured film without a pattern includes, for example, the above-described steps of forming a photosensitive resin film and a step of heat treatment. It may further have a step of exposure.

Examples of the substrate include a glass substrate, a semiconductor substrate such as a Si substrate (a silicon wafer), a metal-oxide-insulator substrate such as a $TiO_2$ substrate, and a $SiO_2$ substrate, a silicon nitride substrate, a copper substrate, a copper alloy substrate, and the like.

The application method is not particularly limited, but can be performed using a spinner or the like.

The drying can be performed using a hot plate, an oven, or the like.

The drying temperature is preferably 90 to 150° C., and when the component (D) is contained, from the viewpoint of ensuring dissolution contrast, 90 to 120° C. is more preferable in order to suppress the reaction of the component (A) and the component (D).

The drying time is preferably 30 seconds to 5 minutes.

The drying may be performed two or more times.

By the above-mentioned method, a photosensitive resin film can be obtained by forming the photosensitive resin composition described above into a film.

The thickness of the photosensitive resin film is preferably 5 to 100 μm, more preferably 8 to 50 μm, and still more preferably 10 to 30 μm.

The pattern exposure is carried out, for example, by exposure through a photomask with a predetermined pattern.

Examples of the active light to be irradiated include ultraviolet rays such as i-ray, visible ray, radiant ray, and the like, and i-ray is preferable.

As the exposure apparatus, a parallel exposure machine, a projection exposure machine, a stepper, a scanner exposure machine, or the like can be used.

A patterned resin film can be obtained by developing. Generally, when a negative photosensitive resin composition is used, the unexposed portions are removed with a developer.

As an organic solvent used as the developer, a good solvent for the photosensitive resin film can be used alone, or a good solvent and a poor solvent for the photosensitive resin film can be used as a mixture in an appropriate ratio Examples of the good solvents include N-methyl-pyrrolidone, N-acetyl-2-pyrrolidone, N,N-dimethylacetamide, N,N-dimethylformamide, dimethylsulfoxide, γ-butyrolactone, α-acetyl-γ-butyrolactone, cyclopentanone, cyclohexanone, and the like.

Examples of the poor solvents include toluene, xylene, methanol, ethanol, isopropanol, propylene glycol monomethyl ether acetate, propylene glycol monomethyl ether, water, and the like.

A surfactant may be added to the developer. The amount of the surfactant is preferably 0.01 to 10 parts by mass and more preferably 0.1 to 5 parts by mass based on 100 parts by mass of the developer.

The development time can be, for example, twice as long as the time during the photosensitive resin film is immersed in the developer until the dissolution is finished.

The development time also varies depending on the kind of the component (A) used, but is preferably from 10 seconds to 15 minutes, more preferably from 10 seconds to 5 minutes, and from the viewpoint of productivity still more preferably from 20 seconds to 5 minutes.

After development, washing may be performed with a rinse solution.

The rinse solution includes distilled water, methanol, ethanol, isopropanol, toluene, xylene, propylene glycol monomethyl ether acetate, propylene glycol monomethyl ether, and the like. These rinse solutions may be used alone, or may be used in combination depending on the steps.

A patterned cured film can be obtained by heat-treating the patterned resin film.

The polyimide precursor of the component (A) may undergo a dehydration ring-closing reaction in the heat treatment step to become the corresponding polyimide.

The temperature of the heat treatment is preferably 250° C. or lower, more preferably 120 to 250° C., and still more preferably 200° C. or lower or 150 to 200° C.

Within the above temperature range, damage to the substrate and the device can be suppressed small, the device can be produced with a high yield, and energy saving of the process can be realized.

The time of the heat treatment is preferably 5 hours or less, more preferably 30 minutes to 3 hours. Within the above time range, the crosslinking reaction or the dehydration ring closure reaction can sufficiently proceed.

The heat treatment may be conducted in an air atmosphere or in an inert atmosphere such as nitrogen, but from the viewpoint of preventing oxidation of the patterned resin film, the nitrogen atmosphere is preferable.

Examples of the devices used for the heat treatment include a quartz tube oven, a hot plate, a rapid thermal annealing, a vertical diffusion furnace oven, an infrared curing oven, an electron beam curing oven, a microwave curing oven, and the like.

[Interlayer Insulating Film, Cover Coat Layer, Surface Protective Film, Electronic Component]

The patterned cured film of the invention can be used as a passivation film, a buffer coat film, an interlayer insulating film, a cover coat layer, a surface protective film, or the like.

By the use of one or more selected from the group consisting of the passivation film, the buffer coat film, the interlayer insulating film, the cover coat layer, the surface protective film, and the like, highly reliable electronic components such as semiconductor devices, multilayer wiring boards, and various electronic devices can be produced.

An exemplary process for producing a semiconductor device as the electronic component of the invention will be described with reference to the drawings.

FIG. 1 is a process diagram of a method for producing a semiconductor device having a multi-layer wiring structure as the electronic component according to an embodiment of the invention.

In FIG. 1, a semiconductor substrate 1 such as a Si substrate having a circuit device is covered with a protective film 2 such as a silicon oxide film except for a predetermined portion of the circuit device, and a first conductive layer 3 is formed on the exposed circuit device. Thereafter, an interlayer insulating film 4 is formed on the semiconductor substrate 1 on which the first conductive layer 3 is formed.

Next, a photosensitive resin layer 5 such as a chlorinated rubber-based resin, or a phenolic novolac-based resin is formed on the interlayer insulating film 4, and a window 6A is provided by a known photolithography technique in order to expose a predetermined portion of the interlayer insulating film 4.

The interlayer insulating film 4 having the window 6A is selectively etched to provide a window 6B.

Next, the photosensitive resin layer 5 is removed by using an etchant that can corrode the photosensitive resin layer 5 without corroding the first conductive layer 3 exposed through the windows 6B.

Further, the second conductive layer 7 is formed on the first conductive layer 3 by using a known photolithography technique, and electrically connected thereto.

In the case of forming a multilayer wiring structure composed of three or more layers, each layer can be formed by conducting the above steps repeatedly.

Next, by using the above-described photosensitive resin composition, a surface protective film 8 is formed, which has a window 6C opened by pattern exposure. The surface protective film 8 protects the second conductive layer 7 from external stress, a rays, and the like, and the resulting semiconductor device is excellent in reliability.

In the above-mentioned example, the interlayer insulating film 4 can also be formed using the photosensitive resin composition of the invention.

EXAMPLES

Hereinafter, the present invention will be described specifically on the basis of Examples and Comparative Examples. The present invention is not limited to the following Examples.

Synthesis Example 1 (Synthesis of Polymer I)

7.07 g of 3,3',4,4'-diphenyl ether tetracarboxylic acid dianhydride (ODPA) and 4.12 g of 2,2'-dimethylbiphenyl-4,4'-diamine (DMAP) were dissolved in 30 g of NMP, stirred at 30° C. for 4 hours, and then stirred overnight at room temperature to obtain a polyamide acid. To this solution, 9.45 g of trifluoroacetic anhydride was added under water cooling, stirred at 45° C. for 3 hours, and 7.08 g of 2-hydroxyethyl methacrylate (HEMA) was added thereto. The reaction solution was added dropwise to distilled water, and the precipitate was collected by filtration, and dried under reduced pressure to obtain a polyimide precursor (hereinafter, referred to as "Polymer!").

The number average molecular weight of Polymer I was determined by standard polystyrene conversion using GPC method under the following conditions. The number average molecular weight of Polymer I was 40,000.

The number average molecular weight was measured using a solution of 0.5 mg of Polymer I in 1 ml of a solvent mixture [tetrahydrofuran (THF)/dimethylformamide (DMF)=1/1 (volume ratio)].

Measuring instrument: Detector L4000UV manufactured by Hitachi, Ltd.

Pumps: L6000 manufactured by Hitachi, Ltd.

Data processor: C-R4A Chromatopac manufactured by SHIMADZU CORPORATION

Column: two Gelpack GL-S300MDT-5

Eluent: THF/DMF=1/1 (volume ratio)

LiBr (0.03 mol/L), $H_3PO_4$ (0.06 mol/L)

Flow rate: 1.0 mL/min

Detector: UV 270 nm

The esterification ratio of Polymer I (the reaction ratio of HEMA with the carboxy group of ODPA) was calculated through NMR-measurement under the following condition. The esterification ratio was 80 mol % based on the total moles of carboxy groups and the total moles of carboxy esters (the remaining 20 mol % were occupied by carboxy groups).

Measuring instrument: AV400M manufactured by Bruker Japan K.K.

Magnetic field strength: 400 MHZ

Reference substance: tetramethylsilane (TMS)

Solvent: Dimethyl sulfoxide (DMSO)

Components used in Examples and Comparative Examples are as follows.

(Component (A): Polyimide Precursor Having a Polymerizable Unsaturated Bond)

Polymer I: Polymer I Obtained in Synthesis Example 1

(Component (B): one or more selected from compounds represented by any of the formulas (1) to (4))

B1: N-formylmorpholine

B2: propylene carbonate

B3: 3-methoxy-N,N-dimethylpropionamide

B4: 1,3-dimethyl-2-imidazolidinone (Component (B'))

B5: γ-butyrolactone

B6: NMP

Note that the component (B) means a component different from the component (B) used in the invention.

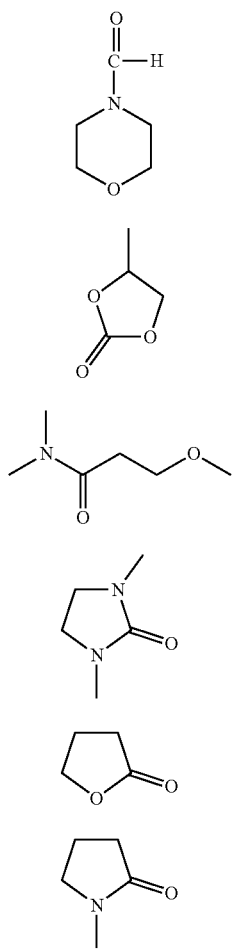

(Component (C): Photopolymerization Initiator)

C1: "IRGACURE OXE 02" (manufactured by BASF Japan Ltd.; ethanone, 1-[9-ethyl-6-(2-methylbenzoyl)-9H-carbazol-3-yl]-, 1-(O-acetyloxime); i.e. a compound represented by the following formula)

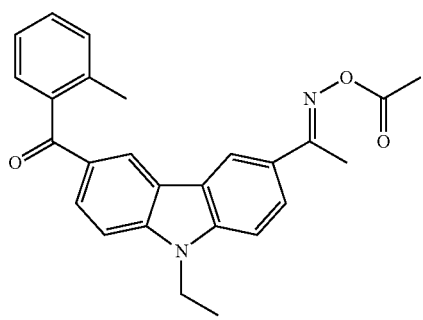 [SMILES: CCn1c2ccc(C(=O)c3ccccc3C)cc2c2cc(/C(C)=N/OC(C)=O)ccc21]

C2: "PDO" (manufactured by Lanbson Ltd., 1-phenyl-1, 2-propanedione-2-(O-ethoxycarbonyl) oxime, i.e. a compound represented by the following formula)

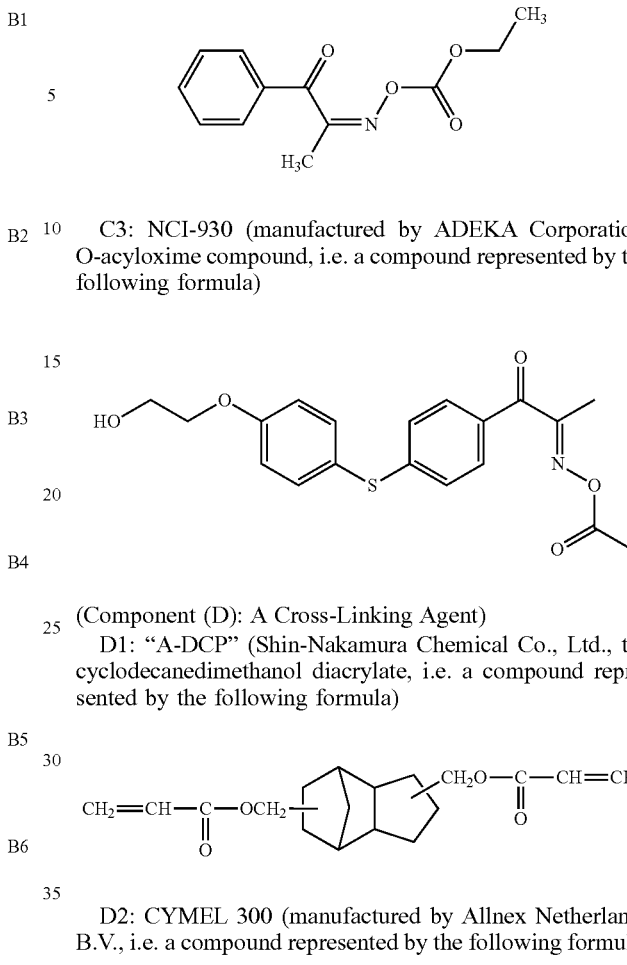

C3: NCI-930 (manufactured by ADEKA Corporation, O-acyloxime compound, i.e. a compound represented by the following formula)

(Component (D): A Cross-Linking Agent)

D1: "A-DCP" (Shin-Nakamura Chemical Co., Ltd., tricyclodecanedimethanol diacrylate, i.e. a compound represented by the following formula)

D2: CYMEL 300 (manufactured by Allnex Netherlands B.V., i.e. a compound represented by the following formula)

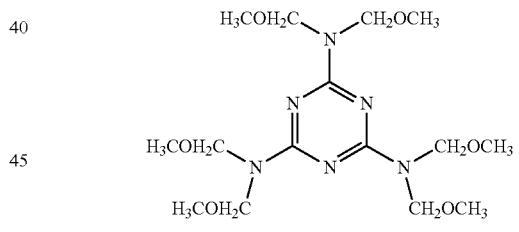

(Component (E): Thermal Polymerization Initiator)

E1: PERCUMYLD (manufactured by NOF CORPORATION, bis(1-phenyl-1-methylethyl) peroxide, i.e. a compound represented by the following formula)

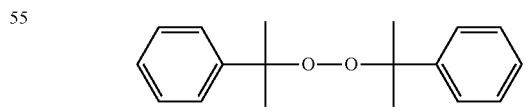

Examples 1 to 3 and Comparative Example 1

[Preparation of Photosensitive Resin Composition]

The photosensitive resin compositions of Examples 1 to 3 and Comparative Example 1 were prepared using each of the components in the amount shown in Table 1. The blending amounts in Table 1 are shown in parts by mass of each component based on 100 parts by mass of the component (A).

[Evaluation of Sensitivity]

The obtained photosensitive resin composition was spin-coated on a silicon wafer using a coating device "Act8" (manufactured by Tokyo Electron Limited), dried at 100° C. for 2 minutes, and then dried at 110° C. for 2 minutes to form a photosensitive resin film having a dried film thickness of 13 μm. The development time was set to twice as long as the time required during the obtained photosensitive resin film was immersed in cyclopentanone until the dissolution was completed.

A photosensitive resin film was produced in the same manner as described above, and the obtained photosensitive resin film was exposed to I-ray in an irradiation dose of 100 to 600 mJ/cm² at 50 mJ/cm² increment through the predetermined pattern using an i-ray stepper FPA-3000iW (manufactured by Canon Inc.). The exposed resin film was paddle-developed by using an "Act8" in cyclopentanone for the above development time, and then rinsed with propylene glycol monomethyl ether acetate (PGMEA) to obtain a patterned resin film.

The remaining film ratio in percentage was calculated by dividing the thickness of the obtained patterned resin film by the thickness of the photosensitive resin film before exposure. An exposure amount capable of forming a patterned resin film having a remaining film ratio of 80% or more was evaluated as the sensitivity.

TABLE 1

|  |  | Example 1 | Example 2 | Example 3 | Comp. Ex. 1 |
|---|---|---|---|---|---|
| Component (A) | Polymer I | 100 | 100 | 100 | 100 |
| Component (B) | B1 | 160 | — | — | — |
|  | B2 | 50 | — | — | — |
|  | B3 | — | 150 | — | — |
|  | B4 | — | — | 150 | — |
| Component (B') | B6 | — | — | — | 150 |
| Component (C) | C1 | 0.2 | 0.2 | 0.2 | 0.2 |
|  | C2 | 5 | 5 | 5 | 5 |
| Component (D) | D1 | 20 | 20 | 20 | 20 |
| Component (E) | E1 | 2 | 2 | 2 | 2 |
| Sensitivity (mJ/cm²) |  | 100 | 250 | 200 | 300 |

Examples 4 and 5 and Comparative Example 2

[Preparation of Photosensitive Resin Composition]

The photosensitive resin composition was prepared and evaluated in the same manner as in Example 1, except that the blending amount of the cross-linking agent (component (D) was changed to 25 parts by mass based on 100 parts by mass of the component (A), and the kind and the blending amount of the component (B) or the component (B) were changed as shown in Table 2. The results are shown in Table 2.

TABLE 2

|  |  | Example 4 | Example 5 | Comp. Ex. 2 |
|---|---|---|---|---|
| Component (A) | Polymer I | 100 | 100 | 100 |
| Component (B) | B1 | — | 20 | — |
|  | B3 | 20 | — | — |

TABLE 2-continued

|  |  | Example 4 | Example 5 | Comp. Ex. 2 |
|---|---|---|---|---|
| Component (B') | B5 | 160 | 160 | — |
|  | B6 | — | — | 160 |
| Component (C) | C1 | 0.2 | 0.2 | 0.2 |
|  | C2 | 5 | 5 | 5 |
| Component (D) | D1 | 25 | 25 | 25 |
| Component (E) | E1 | 2 | 2 | 2 |
| Sensitivity (mJ/cm²) |  | 600 | 600 | 700 |

From Tables 1 and 2, it can be seen that the photosensitive resin composition of the invention using a specific component (B) can produce a pattern with good sensitivity even at a low exposure amount. Further, from Examples 4 and 5, it can be seen that, even if the content of the component (B) is small, the sensitivity increasing effect can be obtained.

Examples 6 and 7

[Preparation and Sensitivity Evaluation of Photosensitive Resin Composition]

The photosensitive resin compositions of Examples 6 and 7 were prepared using each of the components in an amount shown in Table 3. The blending amounts in Table 3 are shown in parts by mass of each component based on 100 parts by mass of the component (A).

By the use of photosensitive resin composition, a patterned resin film was obtained in the same manner as in Examples 1 to 3 and Comparative Example 1.

The obtained patterned resin film was evaluated in the same manner as in Examples 1 to 3 and Comparative Example 1. The sensitivity is shown in Table 3.

[Production of Cured Film]

The above-described patterned resin film was heated at 200° C. for 1 hour in a nitrogen atmosphere using a vertical diffusion furnace μ-TF (manufactured by Koyo Thermo Systems Co., Ltd.) to obtain a patterned cured product (film thickness after curing: 10 μm).

[Appearance Evaluation of Cured Film]

The above-described patterned cured product was visually evaluated for the appearance of the central 5 cm-square portion of the wafer. A product in which no change from the above-mentioned patterned resin film occurred or a product in which less than 30 bubbles were generated was defined as "A". A product in which 30 or more bubbles were generated was defined as "B". Results are shown in Table 3.

[Evaluation of Mechanical Properties]

The obtained patterned cured product formed on the wafer was immersed in a 4.9% by mass aqueous hydrofluoric acid solution to peel as a segment having a width of 10 mm from the wafer.

The peeled 10 mm-wide cured product segment was subjected to a tensile test using Autograph AGS-X 100 N (manufactured by SHIMADZU CORPORATION). The distance between chucks was set to 20 mm, the tensile speed was set to 5 mm/min, and the measurement temperature was set to 18 to 25° C. The mean value was obtained by carrying out the measurement 3 times for the cured product of each Example.

The case where the mean value was 30% or more was defined as "A", and the case where the mean value was less than 30% was defined as "B".

Results are shown in Table 3.

TABLE 3

|  |  | Example 6 | Example 7 |
|---|---|---|---|
| Component (A) | Polymer I | 100 | 100 |
| Component (B) | B3 | 150 | 150 |
| Component (C) | C3 | 1.5 | 1.5 |
| Component (D) | D1 | 20 | — |
|  | D2 | — | 20 |
| Component (E) | E1 | 2 | 2 |
| Sensitivity (mJ/cm$^2$) |  | 200 | 200 |
| Appearance of the cured film |  | A | B |
| Mechanical properties |  | A | B |

INDUSTRIAL APPLICABILITY

The photosensitive resin composition of the invention can be used for an interlayer insulating film, a cover coat layer, a surface protective film, and the like, and the interlayer insulating film, the cover coat layer, and the surface protective film of the invention can be used for an electronic component and the like.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification and the specification of Japanese application(s) on the basis of which the present application claims Paris convention priority are incorporated herein by reference in its entirety.

The invention claimed is:

1. A photosensitive resin composition comprising:
(A) a polyimide precursor having a structural unit represented by the following formula (21):

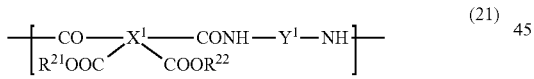

(21)

wherein in the formula (21), $X^1$ is a tetravalent aromatic group; $Y^1$ is a divalent aromatic group; $R^{21}$ and $R^{22}$ are independently a hydrogen atom, a group represented by the following formula (22), or an aliphatic hydrocarbon group including 1 to 4 carbon atoms; at least one of $R^{21}$ and $R^{22}$ is a group represented by the following formula (22); —COOR$^{21}$ group and —CO— group are on the ortho-position to each other; and —COOR$^{22}$ group and —CONH— group are on the ortho-position to each other;

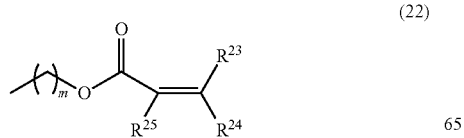

(22)

wherein in the formula (22), $R^{23}$ to $R^{25}$ are independently a hydrogen atom or an aliphatic hydrocarbon group including 1 to 3 carbon atoms; and m is an integer of 1 to 10;

(B) a compound represented by the following formula (3):

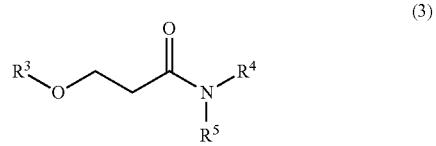

(3)

wherein in the formula (3), $R^3$ to $R^5$ are independently an alkyl group including 1 to 4 carbon atoms;

(C) a photopolymerization initiator represented by the following formula (13) and a photopolymerization initiator represented by the following formula (18):

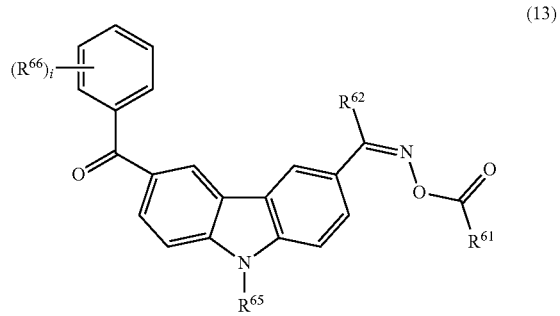

(13)

wherein in the formula (13), $R^{61}$ is an alkyl group including 1 to 12 carbon atoms, an alkoxy group including 1 to 12 carbon atoms, a cycloalkyl group including 4 to 10 carbon atoms, a phenyl group, or a tolyl group; $R^{62}$ is an alkyl group including 1 to 12 carbon atoms, a cycloalkyl group including 4 to 10 carbon atoms, a phenyl group, or a tolyl group; $R^{65}$ is an alkyl group including 1 to 6 carbon atoms; $R^{66}$ is an alkyl group including 1 to 12 carbon atoms or an organic group having an acetal bond; and i is an integer of 1 to 3;

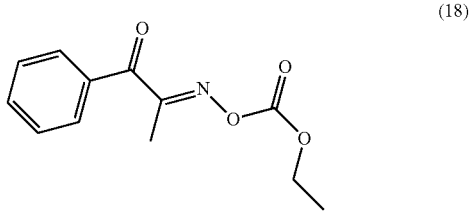 [SMILES: CCOC(=O)O/N=C(\C)C(=O)c1ccccc1]

(18)

(D) one or more cross-linking agents selected from the group consisting of diethylene glycol di(meth)acrylate, triethylene glycol di(meth)acrylate, tetraethylene glycol di(meth)acrylate, trimethylolpropane di(meth)acrylate, trimethylolpropane tri(meth)acrylate, 1,4-butanediol di(meth)acrylate, 1,6-hexanediol di(meth)acrylate, and tricyclodecanedimethanol diacrylate; and
(E) a thermal polymerization initiator.

2. The photosensitive resin composition according to claim 1, comprising the component (B) in an amount from 10 to 10000 parts by mass based on 100 parts by mass of the component (A).

3. A method for manufacturing a patterned cured film comprising:
applying the photosensitive resin composition according to claim 1 on a substrate, followed by drying the photosensitive resin composition to form a photosensitive resin film;
subjecting the photosensitive resin film to pattern-exposure to obtain a resin film;
developing the resin film after the pattern-exposure by using an organic solvent to obtain a patterned resin film; and
heat-treating the patterned resin film.

4. The method for producing a patterned cured film according to claim 3, wherein the heat-treatment is carried out at a temperature of 200° C. or lower.

5. A cured film obtained by curing the photosensitive resin composition according to claim 1.

6. The cured film according to claim 5, which is a patterned cured film.

7. An interlayer insulating film, a cover coat layer, or a surface protective film comprising the cured film according to claim 5.

8. An electronic component comprising the interlayer insulating film, the cover coat layer, or the surface protective film according to claim 7.

9. A photosensitive resin composition, comprising:
(A) a polyimide precursor having a structural unit represented by the following formula (21):

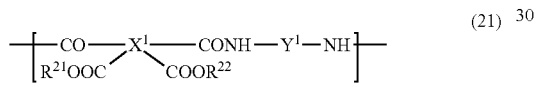
(21)

wherein in the formula (21), $X^1$ is a tetravalent aromatic group; $Y^1$ is a divalent aromatic group; $R^{21}$ and $R^{22}$ are independently a hydrogen atom, a group represented by the following formula (22), or an aliphatic hydrocarbon group including 1 to 4 carbon atoms; at least one of $R^{21}$ and $R^{22}$ is a group represented by the following formula (22); —COOR$^{21}$ group and —CO— group are on the ortho-position to each other; and —COOR$^{22}$ group and —CONH— group are on the ortho-position to each other;

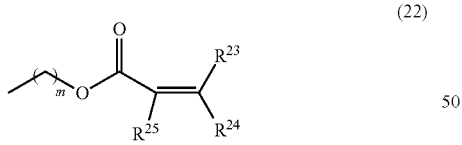
(22)

wherein in the formula (22), $R^{23}$ to $R^{25}$ are independently a hydrogen atom or an aliphatic hydrocarbon group including 1 to 3 carbon atoms; and m is an integer of 1 to 10;

(B) a compound represented by the following formula (3):

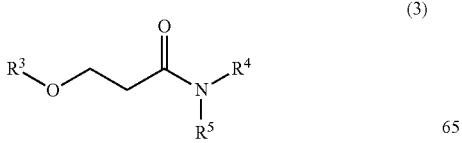
(3)

wherein in the formula (3), $R^3$ to $R^5$ are independently an alkyl group including 1 to 4 carbon atoms, and one or more selected from compounds represented by any of the following formulas (1), (2) and (4):

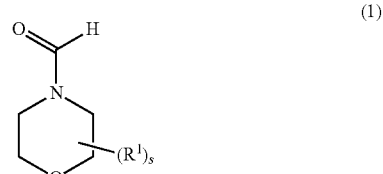
(1)

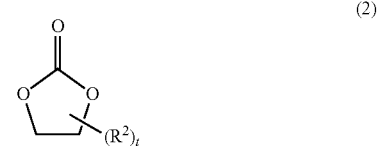
(2)

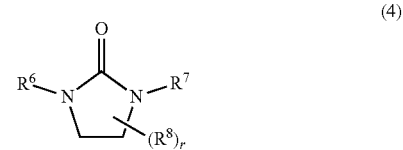
(4)

wherein in the formulas (1), (2) and (4), $R^1$, $R^2$, and $R^8$ are independently an alkyl group including 1 to 4 carbon atoms, and $R^6$ and $R^7$ are independently a hydrogen atom, or an alkyl group including 1 to 4 carbon atoms; s is an integer of 0 to 8; t is an integer of 0 to 4; r is an integer of 0 to 4;

(C) a photopolymerization initiator represented by the following formula (13) and a photopolymerization initiator represented by the following formula (18):

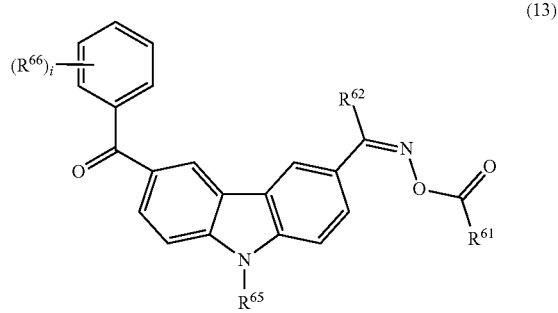
(13)

wherein in the formula (13), $R^{61}$ is an alkyl group including 1 to 12 carbon atoms, an alkoxy group including 1 to 12 carbon atoms, a cycloalkyl group including 4 to 10 carbon atoms, a phenyl group, or a tolyl group; $R^{62}$ is an alkyl group including 1 to 12 carbon atoms, a cycloalkyl group including 4 to 10 carbon atoms, a phenyl group, or a tolyl group; $R^{65}$ is an alkyl group including 1 to 6 carbon atoms; $R^{66}$ is an alkyl group including 1 to 12 carbon atoms or an organic group having an acetal bond; and i is an integer of 1 to 3;

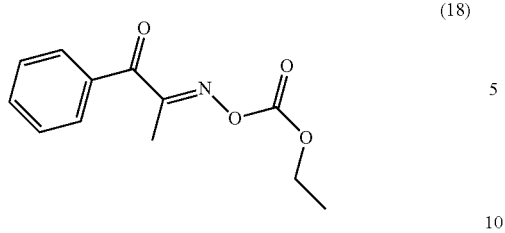

(18)

(D) one or more cross-linking agents selected from the group consisting of diethylene glycol di(meth)acrylate, triethylene glycol di(meth)acrylate, tetraethylene glycol di(meth)acrylate, trimethylolpropane di(meth)acrylate, trimethylolpropane tri(meth)acrylate, 1,4-butanediol di(meth)acrylate, 1,6-hexanediol di(meth)acrylate, and tricyclodecanedimethanol diacrylate; and (E) a thermal polymerization initiator.

* * * * *